United States Patent
Menke et al.

[11] Patent Number: 6,043,648
[45] Date of Patent: Mar. 28, 2000

[54] METHOD FOR TEMPERATURE CALIBRATION OF AN OPTICAL MAGNETIC FIELD MEASUREMENT ARRAY AND MEASUREMENT ARRAY CALIBRATED BY THE METHOD

[75] Inventors: Peter Menke, Bötzow; Thomas Bosselmann, Marloffstein, both of Germany

[73] Assignee: Siemens Aktiengesellschaft, Munich, Germany

[21] Appl. No.: 09/211,111

[22] Filed: Dec. 14, 1998

Related U.S. Application Data

[62] Division of application No. PCT/DE97/01111, Jun. 3, 1997.

[30] Foreign Application Priority Data

Jun. 14, 1996 [DE] Germany .......................... 196 23 810

[51] Int. Cl.[7] .................. G01R 33/032; G01R 19/00; G01J 4/00
[52] U.S. Cl. .................. 324/244.1; 250/225; 324/96; 324/202; 356/364
[58] Field of Search .................. 324/96, 244.1, 324/202, 225; 250/227.17, 225, 231.1; 356/364, 365; 359/281, 283, 284

[56] References Cited

U.S. PATENT DOCUMENTS

| | | | |
|---|---|---|---|
| 4,564,754 | 1/1986 | Sato et al. ........................... | 324/96 X |
| 4,698,497 | 10/1987 | Miller et al. ........................ | 324/96 X |
| 5,008,611 | 4/1991 | Ulmer, Jr. ............................ | 324/96 |
| 5,124,634 | 6/1992 | Ulmer, Jr. et al. .................. | 324/96 |
| 5,416,860 | 5/1995 | Lee et al. ............................ | 324/96 X |
| 5,656,934 | 8/1997 | Bosselmann ....................... | 324/96 |
| 5,715,058 | 2/1998 | Bohnert et al. .................... | 324/96 X |
| 5,764,046 | 6/1998 | Bosselmann ....................... | 324/96 |
| 5,933,000 | 8/1999 | Bosselmann et al. ............ | 324/244.1 X |

FOREIGN PATENT DOCUMENTS

4432146A1 3/1996 Germany .

OTHER PUBLICATIONS

"Temperature Compensation in Magnetooptic AC Current Sensors Using an Intelligent AC–DC Signal Evaluation", Peter Menke et al., Journal of Lightwave Technology, vol. 13, No. 7, Jul. 1995, pp. 1362–1370.

"A Reciprocal–Compensated Fiber–Optic Electric Current Sensor", Fang et al., 8217 Journal of Lightwave Technology 12, Oct. 1994, No. 10, New York, pp. 1882–1890.

*Primary Examiner*—Gerard Strecker
*Attorney, Agent, or Firm*—Herbert L. Lerner; Laurence A. Greenberg; Werner H. Stemer

[57] ABSTRACT

A method for temperature calibration of an optical magnetic field measurement array and a measurement array calibrated by the method include an optical series circuit having a first optical transmission path, a first polarizer, a Faraday sensor device, a second polarizer, and a second optical transmission path. The optical series circuit is temperature-calibrated by adjusting the polarizer angles of the two polarizers in a special way. The calibration method functions even if the intrinsic axis of the linear double refraction in the sensor device is unknown.

12 Claims, 4 Drawing Sheets

METHOD FOR TEMPERATURE CALIBRATION OF AN OPTICAL MAGNETIC FIELD MEASUREMENT ARRAY AND MEASUREMENT ARRAY CALIBRATED BY THE METHOD

CROSS-REFERENCE TO RELATED APPLICATION

This application is a continuation of copending International Application No. PCT/DE97/01111, filed Jun. 3, 1997, which designated the United States.

BACKGROUND OF THE INVENTION

FIELD OF THE INVENTION

The invention relates to a method for temperature calibration of an optical measurement array for measuring a magnetic field, and to an optical measurement array for measuring a magnetic field.

Optical measurement arrays and measuring methods for measuring a magnetic field using the magnetooptical Faraday effect are known. The Faraday effect is understood to mean the rotation of the plane of polarization of linearly polarized light as a function of a magnetic field. The angle of rotation is proportional to the travel integral across the magnetic field along the path traversed by the light, with what is known as Verdet's constant as the proportionality constant. In general, Verdet's constant is dependent on material, temperature and wavelength. In order to measure the magnetic field, a Faraday sensor device formed of an optically transparent material, such as glass, is placed in the magnetic field. The magnetic field causes a rotation of the plane of polarization of linearly polarized light, transmitted through the Faraday sensor device, by a rotary angle that can be evaluated for a measurement signal. One known application of such magnetooptical measuring methods and measurement arrays is to measure electrical currents. To that end, the Faraday sensor device is placed in the vicinity of a current conductor and detects the magnetic field generated in the current conductor by a current. In general, the Faraday sensor device surrounds the current conductor, so that the measured light circulates around the current conductor in a closed path. In that case, the rotary angle is directly proportional in quantity to the amplitude of the current to be measured. The Faraday sensor device may be constructed as a solid glass ring around the current conductor, or it can surround the current conductor with at least one winding, being constructed as a measurement winding including an optical fiber (fiber coil).

Advantages of magnetooptical measurement arrays and measuring methods over conventional inductive current converters are potential separation and insensitivity to electromagnetic interference. Problems are presented, however, by temperature factors and influences of mechanical bending and vibration in the sensor device and the optical transmission paths, especially optical fibers, for transmitting the measurement light.

A magnetooptical measuring system is known from the Journal of Lightwave Technology, Vol. 12, No. 10, Oct. 1994, pp. 1882 to 1890, in which two light signals pass through an optical series circuit including a first optical fiber, a first polarizer, a Faraday sensor device, a second polarizer and a second optical fiber, in opposed directions of circulation. Both light signals, after passing through the optical series circuit, are converted by corresponding photoelectric converters, each into one electrical intensity signal. A fiber coil including a single-mode fiber with low double refraction is provided as the Faraday sensor device. The polarization axes of the two polarizers form a polarizer angle other than zero degrees with one another and preferably it is 45°. Light from a light source is split into two light signals, and both of those light signals are fed into the Faraday fiber coil, each through an optical coupler and an associated transmission optical fiber on opposite ends. An intensity-standardized measurement signal is derived from two electrical intensity signals I1 and I2, which correspond to the light intensities of the two light signals after passing through the series circuit. The intensity-standardized measurement signal corresponds to the quotient $(I1-I2)/(I1+I2)$ of the difference and the sum of the two intensity signals. Intensity losses in the common light path for the two contrary light signals, and in particular vibration-dictated damping in the two optical fibers, can thus be largely compensated for. The Journal of Lightwave Technology, Vol. 12, No. 10, Oct. 1994, pp. 1882 to 1890 does not describe any compensation of temperature influences on the measurement signal. On the contrary, a temperature-insensitive fiber coil is used as the sensor device. However, producing such fiber coils is problematic.

U.S. Pat. No. 5,008,611 discloses a magnetooptical measurement system, in which a measurement light signal passes through a series circuit including a first polarizer, a Faraday element and a second polarizer (analyzer). In order to minimize the temperature influences resulting from the temperature dependency of the linear double refraction in the Faraday element, the angle between the transmission axis of the first polarizer and the intrinsic double refraction axis in the Faraday element is set to 10.3°. In addition, the angle between the transmission axis of the second polarizer and the intrinsic double refraction axis in the Faraday element is set to 55.3°. That setting of the angular values was ascertained empirically and requires previous knowledge of the intrinsic double refraction axis (characteristic direction) of the Faraday element.

SUMMARY OF THE INVENTION

It is accordingly an object of the invention to provide a method for temperature calibration of an optical magnetic field measurement array and a measurement array calibrated by the method, which overcome the hereinafore-mentioned disadvantages of the heretofore-known methods and devices of this general type and with which influences of temperature changes are practically eliminated.

With the foregoing and other objects in view there is provided, in accordance with the invention, a method for temperature calibration of an optical measurement array for measuring a magnetic field, which comprises providing an optical series circuit having a first optical transmission path, a first polarizer with a polarization axis forming a first polarizer angle $\theta$ with a predetermined reference axis, a sensor device indicating the Faraday effect, a second polarizer with a polarization axis forming a second polarizer angle $\eta$ with the reference axis, and a second optical transmission path. These two polarizer angles $\theta$ and $\eta$ are set to optimal values in terms of the temperature insensitivity of the measurement array.

The sensor device is placed in a calibrating magnetic field; at least one light signal is passed through the optical series circuit; and a measurement signal for the calibrating magnetic field is ascertained from a light intensity of the at least one light signal after passing through the series circuit.

In a first calibration step, the first polarizer angle $\theta$ is set to a value $\theta_1$ and the second polarizer angle $\eta$ is set to a value $\eta_1$, thus essentially meeting a condition $\sin(2\theta_1-2\eta_1)=1$ or $\sin(2\theta_1-2\eta_1)=-1$, and a resultant measurement signal is ascertained as a first calibration signal $M_1$ over a predetermined temperature range including at least two temperature values.

In a second calibration step, the first polarizer angle $\theta$ is set to a value $\theta_2$ and the second polarizer angle $\eta$ is set to a value $\eta_2$, thus essentially meeting conditions $\sin(2\theta_2-2\eta_2)=1$ or $\sin(2\theta_2-2\eta_2)=-1$ and $\cos(2\theta_2+2\eta_2)=-\cos(2\theta_1+2\eta_1)$, and a resultant measurement signal is ascertained as a second calibration signal $M_2$ over the predetermined temperature range.

In a third calibration step, a correction factor K is ascertained in such a way that a calibration function $M_K=(2\cdot M_1\cdot M_2)/(M_1+M_2+K\cdot(M_1-M_2))$ dependent on the first calibration signal, the second calibration signal and the correction factor, is substantially constant over the predetermined temperature range.

According to a first embodiment, in a fourth calibration step, the polarizer angles $\theta$ and $\eta$ of the two polarizers are adjusted to essentially meet equations $\sin(2\theta-2\eta)=1$ or $\sin(2\theta-2\eta)=-1$, and $\cos(2\theta+2\eta)=K\cdot\cos(2\theta_1+2\eta_1)$.

According to a second embodiment, in a fourth calibration step, the polarizer angles $\theta$ and $\eta$ of the two polarizers are adjusted in such a way that the resultant measurement signal, for at least one temperature value from the predetermined temperature range, is substantially equal to the calibration function $M_K$.

In both the first and second embodiments, polarizer angles $\theta$ and $\eta$ are obtained with which the measurement array is calibrated to minimal temperature drift. The calibration method functions even if the sensor device of the measurement array has a nonhomogeneous linear double refraction, and even if an intrinsic axis of the linear double refraction in the sensor device cannot be ascertained.

In accordance with another mode of the invention, the optical series circuit of the measurement array is traversed by two light signals in opposite passage directions from one another. The measurement signal is equivalent to a quotient signal of two linear functions of the light intensities of the two light signals, in each case after they have passed through the optical series circuit.

In accordance with a further mode of the invention, the measurement signal is proportional to the quotient of a difference and a sum of the two light intensities, or an effective value of this signal.

In accordance with an added mode of the invention, the optical series circuit is traversed by only one light signal. The calibrating magnetic field is then a substantially constant alternating field, that is a magnetic alternating field with a substantially constant frequency spectrum above a predetermined frequency. The measurement signal is a signal that is proportional to a quotient of an alternating component of the light intensity of the light signal after passing through the series circuit and a direct component of this light intensity. The alternating component substantially includes the entire frequency spectrum of the calibrating magnetic field, while the direct component has no frequencies from the frequency spectrum of the calibrating magnetic field, and thus is not dependent on the calibrating magnetic field. This measurement signal is intensity-standardized.

With the objects of the invention in view there is also provided an optical measurement array for measuring a magnetic field, comprising an optical series circuit including a first optical transmission path, a first polarizer having a polarization axis forming a first polarizer angle $\theta$ with a predetermined reference axis, a sensor device indicating the Faraday effect, a second polarizer having a polarization axis forming a second polarizer angle $\eta$ with the reference axis, and a second optical transmission path. The two polarizer angles $\theta$ and $\eta$ are adjusted in accordance with the first or second embodiment of the method.

In accordance with a concomitant feature of the invention, the sensor device has a nonhomogeneous linear double refraction.

Other features which are considered as characteristic for the invention are set forth in the appended claims.

Although the invention is illustrated and described herein as embodied in a method for temperature calibration of an optical magnetic field measurement array and a measurement array calibrated by the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
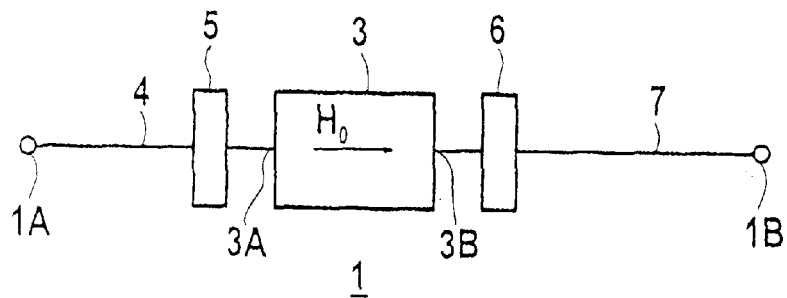
FIG. 1 is a schematic and diagrammatic view of a measurement array to be calibrated for measuring a magnetic field with a Faraday sensor device.

Referring now in detail to the figures of the drawings, in which elements that correspond with one another are provided with the same reference numerals, and first, particularly, to FIG. 1 thereof, there is seen a measurement array which includes an optical series circuit 1 having a first optical transmission path 4, a first polarizer 5, a sensor device 3, a second polarizer 6 and a second optical transmission path 7. The sensor device 3 is provided with first and second optical terminals 3A and 3B, in such a way that light input at one of the terminals 3A or 3B passes through the sensor device 3 and is output again at the other respective terminal 3B or 3A. The first terminal 3A of the sensor device 3 is optically coupled to one end of the first optical transmission path 4 through the first polarizer 5. The second terminal 3B of the sensor device 3 is optically coupled to one end of the second optical transmission path 7 through the second polarizer 6. An end of the first optical transmission path 4 remote from the first polarizer 5 forms a first terminal 1A of the series circuit 1. An end of the second optical transmission path 7 remote from the second polarizer 6 forms a second terminal 1B of the series circuit 1. If measurement light is input at one of the terminals 1A or 1B, then the measurement light is transmitted through the series circuit 1 and output from the series circuit 1 again at the other respective terminal 1B or 1A.

The sensor device 3 is formed of at least one material that indicates the magnetooptical Faraday effect, and it can be constructed in a manner known per se with one or more solid bodies, preferably of glass, or with at least one optical fiber.

One problem in measuring a magnetic field with a measurement array according to FIG. 1 is presented by temperature influences in the sensor device 3. Those temperature influences induce a linear double refraction δ as a function δ(T) of the temperature T in the sensor device 3, which can adulterate the measurement of the magnetic field. Temperature changes can also change Verdet's constant and thus the measurement sensitivity.

In order to keep those temperature influences as slight as possible, the measurement array is temperature-calibrated by a calibrating method. To that end, the sensor device 3 is placed in a calibrating magnetic field $H_0$.

Figure 2:
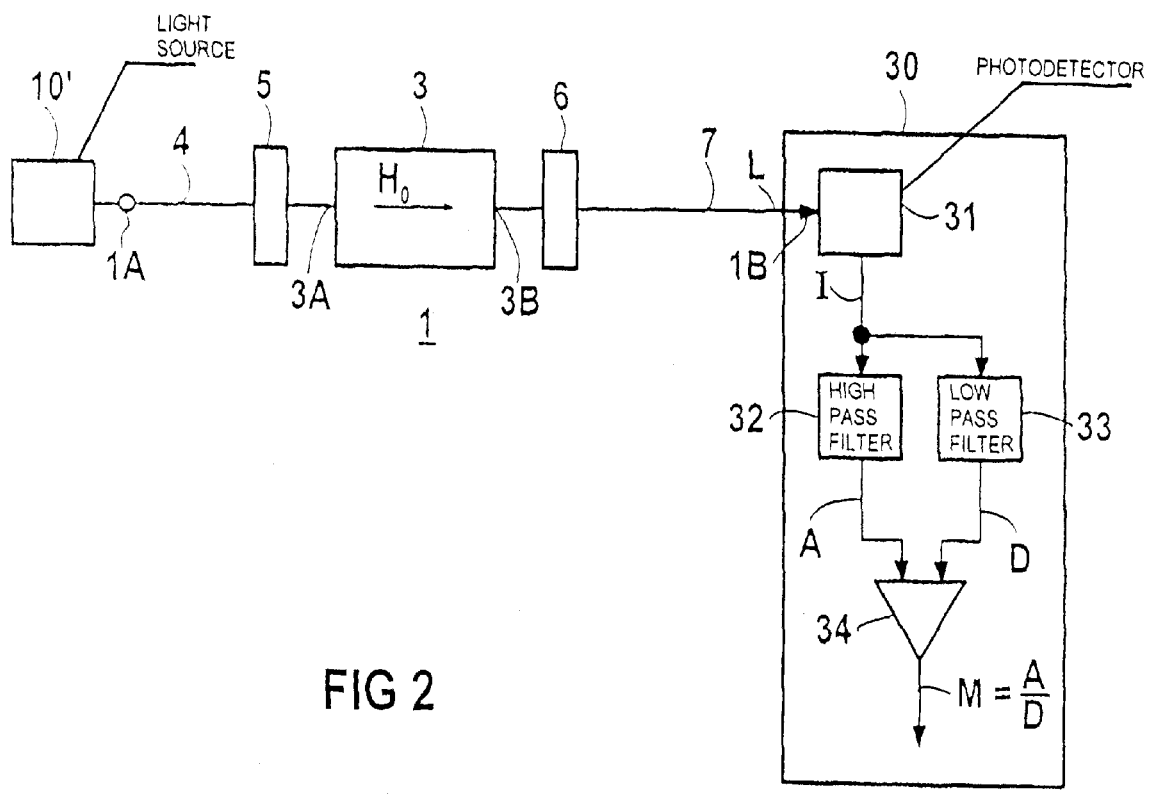
FIG. 2 is a schematic and diagrammatic view of a measurement array to be calibrated for measuring a magnetic field with a light signal.

In a first embodiment of the calibration method shown in FIG. 2, only a single light signal L is passed through the optical series circuit 1. To that end, the terminal 1A, for instance, of the series circuit 1 is optically coupled with a light source 10'. A magnetic alternating field with a substantially constant frequency spectrum above a predetermined frequency is used as the calibrating magnetic field $H_0$. After passing through the series circuit 1, a measurement signal M is derived from the light signal L by an evaluation device 30. The measurement signal M is proportional to a quotient of an alternating component A of the light intensity of the light signal after passing through the series circuit and a direct component D of that light intensity. The alternating component essentially includes the entire frequency spectrum of the calibrating magnetic field, while the direct component has no frequencies from the frequency spectrum of the calibrating magnetic field, or in other words it does not depend on the calibrating magnetic field. To that end, a photodetector 31 is associated with the terminal 1B of the series circuit 1 for converting the light signal L into an electrical intensity signal I as a measure of the light intensity of the light signal L. The alternating signal component A is formed from this electrical intensity signal I as a measure for the alternating component of the light intensity, with a high-pass filter 32. The direct signal component D is formed from this electrical intensity signal I as a measure for the direct component of the light intensity, with a low-pass filter 33. A divider 34 forms the quotient A/D of the alternating signal component A and the direct signal component D of the intensity signal I, forming the measurement signal M. The measurement signal M which is thus formed is intensity-standardized but is still temperature-dependent.

In another embodiment of the calibrating method, two light signals are sent in opposite directions through the series circuit 1 and are subsequently subjected to signal evaluation. A quotient signal of two linear functions of the light intensities of the two light signals, in each case after passing through the optical series circuit, and preferably a signal proportional to the quotient of a difference and the sum of the two light intensities, or an effective value of this signal, is determined as the measurement signal. This measurement signal is also intensity-standardized, but is still temperature-dependent. In this embodiment, a magnetic field that is constant over time is preferably used as the calibrating magnetic field $H_0$. An advantageous embodiment of a measurement array for this kind of calibrating method of two light signals is shown in FIG. 3.

Figure 3:
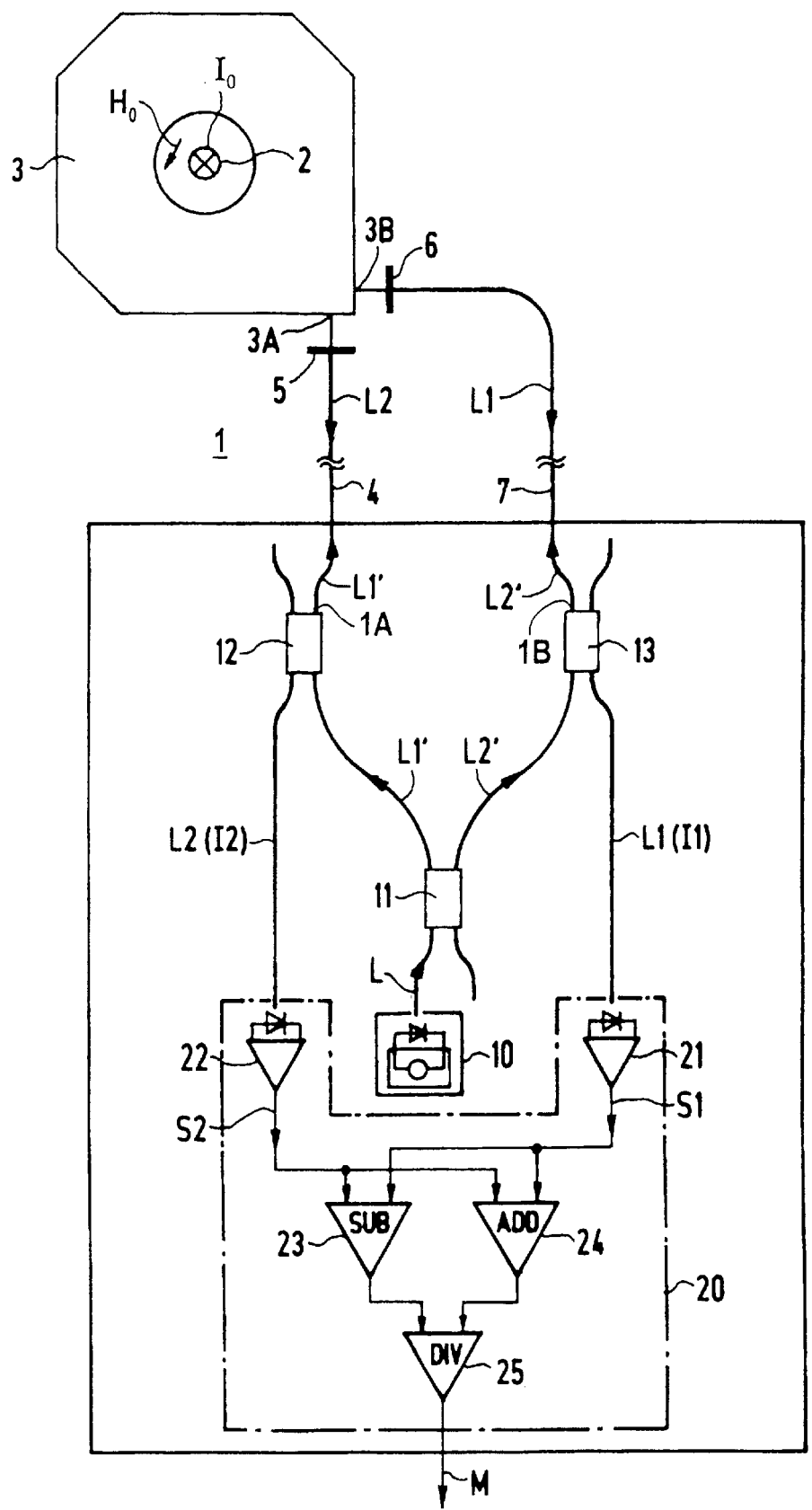
FIG. 3 is a schematic and diagrammatic view of a measurement array for measuring an electrical current with two light signals.

The measurement array of FIG. 3 includes measures for transmitting two light signals L1' and L2' through the series circuit 1, which pass through it in opposite directions, and an evaluation device 20 for evaluating the light signals L1 and L2 after they pass through the series circuit 1. The measures for transmitting the two light signals L1' and L2' include a light source 10 and three optical couplers 11, 12 and 13. The other end of the first transmission path 4 which is remote from the sensor device 3 is optically connected (at the terminal 1A of the series circuit 1) through the optical coupler 12 with both the optical coupler 11 and the evaluation device 20. The other end of the second transmission path 7 which is remote from the sensor device 3 is also optically connected (at the terminal 1B of the series circuit 1) through the optical coupler 13 with both the optical coupler 11 and the evaluation device 20. The optical coupler 11 is optically connected to the light source 10, and it splits the light L of the light source 10 into the two light signals L1' and L2'. The light signals L1' and L2' are delivered to the respective couplers 12 and 13 and then are input to the respective first and second transmission paths 4 and 7. Both light signals L1' and L2' pass through the optical series circuit 1 having the first transmission path 4, the first polarizer 5, the sensor device 3, the second polarizer 6 and the second transmission path 7, in passage directions that are opposite one another, and are output from the series circuit again as light signals which are respectively designated with reference symbols L1 and L2.

The couplers 11, 12 and 13 may be at least partly replaced by optical beam splitters. Furthermore, instead of the coupler 11 and one light source 10, two light sources may be provided, each of which transmit one respective light signal L1' and L2'. The measures for transmitting two light signals L1 and L2 through the series circuit, traversing it in opposite directions, may furthermore be constructed as two photoelectric converters operated in alternation as transmitters and receivers. They are then also provided in order to convert the light signals L1 and L2, after passing through the series circuit, into electrical intensity signals.

The first light signal L1', after passing through the first transmission path 4, is linearly polarized by the first polarizer 5 and is fed, as a linearly polarized light signal L1', into the sensor device 3 at the terminal 3A. Upon passing through the sensor device 3, the polarization plane of the linearly polarized first light signal L1' is rotated by a Faraday measurement angle that is dependent on the calibrating magnetic field $H_0$. The first light signal L1', which is rotated about the measurement angle in its polarization plane, is then delivered to the second polarizer 6. The second polarizer 6 allows only the component of the oncoming first light signal L1' that is projected onto its polarization axis to pass through, and thus has the function of a polarization analyzer for the first light signal L1'. The component of the first light signal L1' transmitted by the second polarizer 6 is designated L1 and is transmitted to the evaluation device 20 through the second transmission path 7 and the coupler 13.

The second light signal L2' first passes through the second transmission path 7 and is then linearly polarized by the second polarizer 6. The linearly polarized second light signal L2' is input to the sensor device 3 at the terminal 3B. Upon passing through the sensor device 3, the polarization plane of the linearly polarized second light signal L2' is rotated by a Faraday measurement angle dependent on the calibrating magnetic field $H_0$. The angle has the opposite sign, because of the non-reciprocal property of the Faraday effect, and has the same quantity as the first light signal L1'. The second light signal L2', which is rotated in its polarization plane about the measurement angle, is then delivered to the first polarizer 5. The first polarizer 5 allows only the component of the oncoming second light signal L2 that is projected on its polarization axis to pass through, and thus acts as a polarization analyzer of the second light signal L2'. The component of the second light signal L2' which is transmitted by the first polarizer 5 is designated L2 and is transmitted through the first transmission path 4 and the coupler 12 to the evaluation device 20.

Light intensities I1' and I2' of the two light signals L1' and L2', before being input into the series circuit, are generally set to a fixedly predetermined ratio relative to one another. Preferably, both light intensities are the same, that is I1'=I2'. Therefore, in the embodiments shown, the coupler 11 splits the light L of the light source 10 into two equal parts with a coupling ratio of 50%:50%.

Upon traversing the two transmission paths 4 and 7, both respective light signals L1', L1 and L2', L2 undergo the same changes in intensity, which can be caused in particular by damping losses resulting from mechanical vibration. These changes in intensity are essentially expressed as damping factors in the light intensities I1 and I2. The real damping factor, which is generally time-dependent of an optical transmission path, is defined as the ratio of the light intensity of light arriving at one end of the transmission path to the input light intensity as the light is input at the other end of the transmission path. The damping factors of the transmission paths 4 and 7 are eliminated since the evaluation device 20 derives a quotient signal, in general in the form of a measurement signal M for the calibrating magnetic field $H_0$. The quotient signal takes the form $$M=(a \cdot I1+b \cdot I2+c)/(d \cdot I1+e \cdot I2+f) \quad (1)$$

from two linear functions $(a \cdot I1+b \cdot I2+c)$ and $(d \cdot I1+e \cdot I2+f)$ of the two light intensities I1 and I2 with real coefficients a, b, c, d, e and f. At least either the coefficients a and e, or the coefficients b and d, are other than zero.

This measurement signal M is practically independent of changes in intensity which are caused in particular by vibration in the transmission paths 4 and 7. Thus in all of the embodiments, even simple, comparatively inexpensive telecommunications optical fibers (multimode fibers) can be used as the transmission paths 4 and 7, since the relatively high damping and vibration sensitivity of those fibers are compensated for in the measurement signal M. However, other optical fibers or free-beam arrays can also be used.

The coefficients a, b, c, d, e and f of the linear functions in the numerator and denominator of equation (1) can in particular be adapted to different input intensities of the two light signals upon being input into the series circuit. The coefficients d, e and f of the linear function $d \cdot I1+e \cdot I2+f$ in the denominator of the quotient in equation (1) are preferably set in such a way that the linear function $d \cdot I1+e \cdot I2+f$ is practically constant and is thus independent of the magnetic field $H_0$.

In particular, when the input intensities I1' and I2' of both light signals L1' and L2' are approximately the same, it is possible in the advantageous embodiment shown in FIG. 3 to also use the quotient $$M=(I1-I2)/(I1+I2)$$

of a difference I1–I2 (or I2–I1) and the sum I1+I2 of the two light intensities I1 and I2 after passing through the series circuit as the measurement signal M. In the embodiment shown, the evaluation device 20 for deriving the measurement signal M has first and second photoelectric converters 21 and 22, a subtractor 23, an adder 24 and a divider 25. The first converter 21 is optically connected to the coupler 13 and converts the first light signal L1, after it has passed through the series circuit, into a first electrical intensity signal S1, having a signal intensity which corresponds to the light intensity I1 of the first light signal L1. The second converter 22 is optically connected to the coupler 12 and converts the second light signal L2, after it has passed through the series circuit, into a second electrical intensity signal S2 as a measure of the light intensity I2 of the second light signal L2. The two intensity signals S1 and S2 are each delivered to one respective input of the subtractor 23 and of the adder 24. The difference signal S1–S2 (or S2–S1) at the output of the subtractor 23 and the summation signal S1+S2 at the output of the adder 24 are each delivered to one respective input of the divider 25. The output signal of the divider (S1–S2)/(S1+S2) is utilized as the measurement signal M and is switched to one output of the evaluation device 20. This embodiment has the advantage of using analog components, which as a rule are faster than digital components.

In a non-illustrated embodiment, the two electrical intensity signals can also first be digitized, although with the aid of an analog/digital converter, and then the digitized signals can be further processed by a microprocessor or a digital signal processor.

It is possible in particular to compensate for different sensitivities of the two photoelectric converters 21 and 22 by adapting the coefficients a, b, c, d, e and f in the general measurement signal $M=(a \cdot I1+b \cdot I2+c)/(d \cdot I1+e \cdot I2+f)$.

The measurement array to be calibrated in FIG. 3 is preferably intended for measuring an electrical current $I_0$ in at least one current conductor 2. The sensor device 3 then detects the magnetic field generated inductively by this current $I_0$. The sensor device 3 preferably surrounds the current conductor 2, so that both light signals L1' and L2' run around the current $I_0$ in a practically closed light path. In this case, the measurement angle is directly proportional to the electrical current $I_0$. The sensor device 3 may be constructed as a solid glass ring with inner reflective surfaces that deflect the light signals L1' and L2', or it may be constructed in some other known way. The constant calibrating magnetic field $H_0$ can be set by adjusting a constant current $I_0$ in the current conductor 2.

The temperature dependency of the measurement signal M is essentially eliminated through the use of the calibration method for temperature compensation described below. The calibration is carried out through the use of an optimal setting of polarizer angles of the two polarizers 5 and 6.

Figure 4:
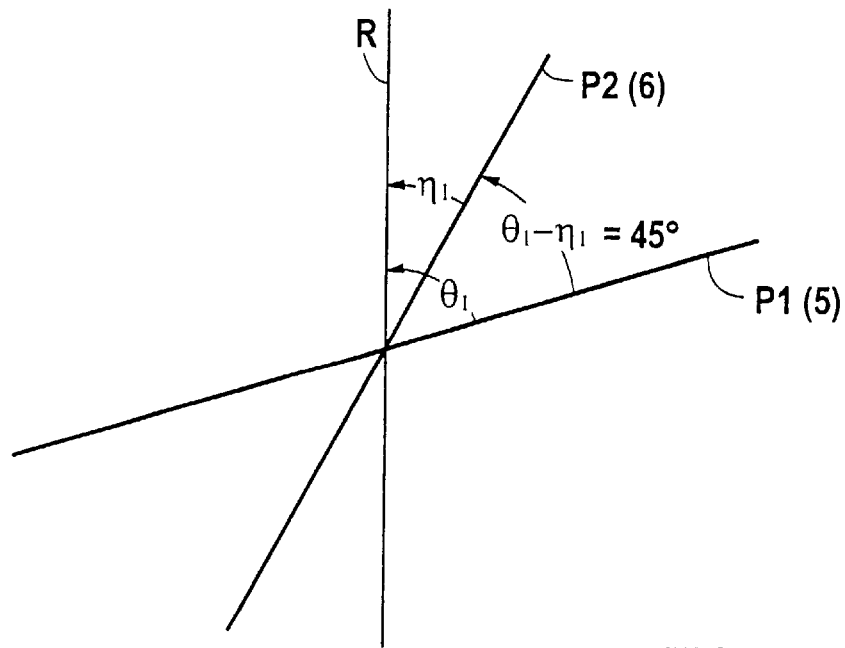
FIGS. 4–6 are graphs illustrating three possible calibration steps for setting optimal polarizer angles.
Figure 5:
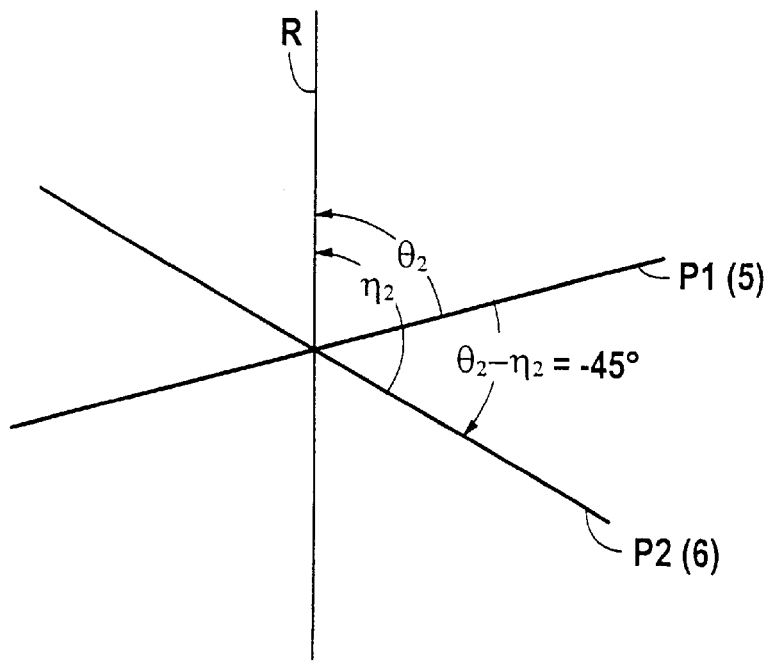
Figure 6:
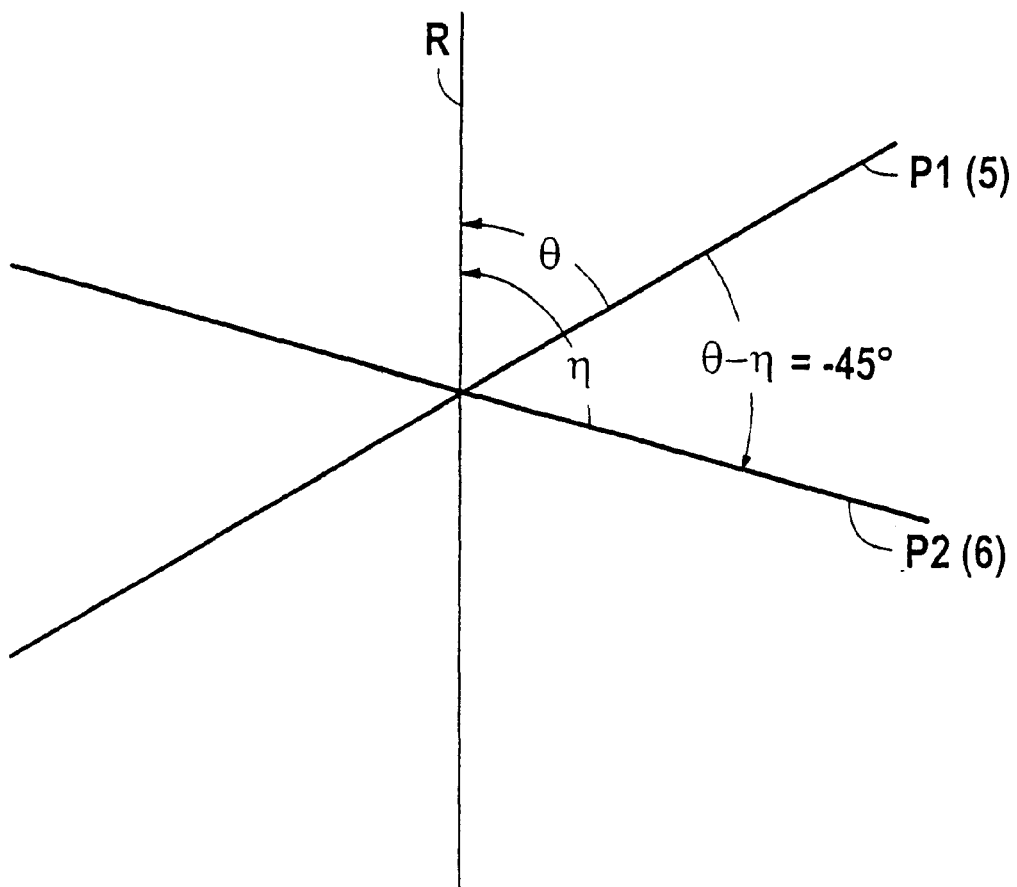

FIGS. 4–6 show three possible calibration steps for setting these optimal polarizer angles of the polarizers 5 and 6. In FIGS. 4–6, a polarization axis (transmission axis, characteristic axis, intrinsic axis) of the first polarizer 5 is designated P1, and a polarization axis of the second polarizer 6 is designated P2. The polarization axes P1 and P2 are located in a plane oriented perpendicular to the light propagation direction of the light passing through the polarizers 5 and 6. A reference axis, which can be predetermined arbitrarily and is also located in this plane, is designated R. The polarization axis P1 of the first polarizer 5 forms a first polarizer angle θ with the predetermined reference axis R, while the polarization axis P2 of the second polarizer 6 is oriented at a second polarizer angle η relative to the reference axis R.

In a first calibration step, the polarizer angles θ and η of the two respective polarizers 5 and 6 are set in such a way that a maximum small-signal sensitivity is achieved. To that end, the first polarizer angle θ is set to a first calibration value $θ_1$ and the second polarizer angle η is set to a first calibration value $η_1$, essentially in accordance with the equation $$\sin(2\theta_1 - 2\eta_1) = 1 \tag{1a}$$

$$\text{or } \sin(2\theta_1 - 2\eta_1) = -1 \tag{1b}$$

With the thus-set polarizer angles $\theta = \theta_1$ and $\eta = \eta_1$, the resultant measurement signal M is plotted as a first calibration signal $M_1$ over a predetermined temperature range, including at least two temperature values, and is stored in memory. The temperature range is selected in accordance with the expected temperatures of use of the measurement array. One or the other of the conditions (1a) or (1b) is met in particular if the polarization axes P1 and P2 form an angle of $\pm 45°$ ($\pm \pi/4$) with one another.

FIG. 4 shows an exemplary embodiment in which the polarizer angles $\theta$ and $\eta$ are set to respective calibration values $\theta_1$ and $\eta_1$ that meet condition (1a). The polarization axis P2 of the second polarizer 6 is inclined relative to the polarization axis P1 of the first polarizer 5 by the angle $\theta_1 - \eta_1 = 45°$. Positive angles in this case and below indicate the mathematically positive direction of revolution (counterclockwise).

In a second calibration step, the first polarizer angle $\theta$ is set to a calibration value $\theta_2$, and the second polarizer angle $\eta$ is set to a calibration value $\eta_2$, so that essentially the condition $$\sin(2\theta_2 - 2\eta_2) = 1 \tag{2a}$$

$$\text{or } \sin(2\theta_2 - 2\eta_2) = -1 \tag{2b}$$

on one hand, and at the same time the condition $$\cos(2\theta_2 + 2\eta_2) = -\cos((2\theta_1 + 2\eta_1) \tag{3}$$

on the other hand, are met. With the thus-set polarizer angles $\theta = \theta_2$ and $\eta = \eta_2$, the resultant measurement signal M is ascertained as a second calibration signal $M_2$ over the predetermined temperature range, and is likewise stored in memory. In order to set the polarizer angles $\theta$ and $\eta$ to their second calibration values $\theta_2$ and $\eta_2$, it is possible, for instance, compared with the first calibration values $\theta_1$ and $\eta_1$ to rotate the polarization axis P1 or P2 of one of the two polarizers 5 and 6 farther by 90°, or to rotate both polarization axes P1 and P2 farther, each by 45°.

FIG. 5 shows an especially easily set embodiment of the second calibration step. In comparison to the setting in FIG. 4, the polarization axis P1 of the first polarizer 5 is unchanged. In other words, $\theta_1 = \theta_2$, and only the second polarizer 6 is rotated by $-90°$ relative to the reference axis R, that is $\eta_2 = \eta_1 + 90°$. The angle formed by the two polarization axes P1 and P2 is then $\theta_2 - \eta_2 = -45°$.

The calibration signals $M_1$ and $M_2$ obtained from the first calibration step and the second calibration step are respective functions $M_1(T)$ and $M_2(T)$ of the temperature T over the predetermined temperature range and can be analytically described in a good approximation as follows:

$$M_1(T) = \frac{f_1(T)}{1 + \cos(2\theta_1 + 2\eta_1)f_2(T)} \tag{4}$$

$$M_2(T) = \frac{-f_1(T)}{1 + \cos(2\theta_2 + 2\eta_2)f_2(T)} = \frac{-f_1(T)}{1 - \cos(2\theta_1 + 2\eta_1)f_2(T)} \tag{5}$$

Solving the two equations (4) and (5) for $f_1(T)$ and $\cos(2\theta_1 + 2\eta_1) f_2(T)$, and inserting a real correction factor K, leads to the equation for the calibration function:

$$M_k(T) = \frac{2M_1 M_2}{M_1 + M_2 + K(M_1 - M_2)} \tag{6}$$

The correction factor K is preferably determined in a third calibration step, through the use of a simple numerical process and with the aid of a digital signal processor or a microprocessor, in such a way that the temperature drift of the associated calibration function $M_K(T)$ becomes minimal. This means that the calibration function $M_K = (2 \cdot M_1 \cdot M_2)/(M_1 + M_2 + K \cdot (M_1 - M_2))$, which is dependent on the first calibration signal $M_1$, the second calibration signal $M_2$, and the correction factor K, is essentially constant over the predetermined temperature range.

If the predetermined temperature range (calibration range) includes only two temperature values $T_a$ and $T_b$, then to that end, with the aid of the corresponding calibration signal values $M_1(T_a)$ and $M_2(T_a)$, as well as $M_1(T_b)$ and $M_2(T_b)$, the equation $$M_K(T_a) = M_K(T_b) \tag{7}$$

is simply solved for the correction factor K.

Conversely, if the predetermined temperature range includes more than two temperature measurement points, then $y = f_1(T) = 2M_1 M_2/(M_2 - M_1)$ can be plotted in a graph relative to $x = \cos(2\theta + 2\eta) f_2(T) = (M_1 + M_2)/(M_2 - M_1)$. This graph is fitted linearly with the function $$y(x) = M_K(1 + Kx) \tag{8}$$

with the fitting parameters $M_K$ and K.

In a fourth calibration step, the polarizer angles $\theta$ and $\eta$ of the two polarizers 5 and 6 are set in accordance with FIG. 6 in such a way that the resultant measurement signal M has minimal temperature drift.

In a first embodiment of this fourth calibration step, the polarizer angles $\theta$ and $\eta$ of the two polarizers 5, 6 are adjusted in such a way that essentially the equations $$\sin(2\theta - 2\eta) = 1 \tag{9a}$$

$$\text{or } \sin(2\theta - 2\eta) = -1 \tag{9b}$$

$$\text{and } \cos(2\theta + 2\eta) = K \cdot \cos(2\theta_1 + 2\eta_1) \tag{10}$$

To that end, by way of example, the polarization axes P1 and P2 can be rotated, as compared to the setting in FIG. 5, in the same direction by the same angle while maintaining the same angle of $-45°$ (condition (9b)) formed by the polarization axes P1 and P2, until such time as condition (10) is met.

In a second embodiment of the fourth calibration step, the polarizer angles $\theta$ and $\eta$ of the two polarizers 5, 6 are adjusted in such a way that the resultant measurement signal M, for at least one temperature value $T_0$ from the predetermined temperature range, is substantially equal to the calibration function $M_K$, and accordingly:

$$M(T_0) = M_K(T_0) \tag{11}$$

In both the first embodiment in accordance with equations (9a), (9b) and (10) and the second embodiment in accordance with equation (11) of the fourth calibration step, the two polarizer angles $\theta$ and $\eta$ of the two respective polarizers 5 and 6 are adjusted optimally for minimal temperature dependency of the measurement signal M in the predetermined temperature range.

Instead of the measurement signal M itself, in all of the embodiments it is also possible to use the effective value of the measurement signal M for the temperature calibration, if alternating magnetic fields are to be measured.

One fundamental advantage of temperature compensation by setting the polarizer angles η and θ is the high bandwidth upon measuring magnetic fields H or electrical currents I. The frequency spectrum of the magnetic fields H or electrical currents I to be measured is not in fact limited in principle by the provisions made for temperature compensation.

We claim:

1. A method for temperature calibration of an optical measurement array for measuring a magnetic field, which comprises:

a) providing an optical series circuit having a first optical transmission path, a first polarizer with a polarization axis forming a first polarizer angle θ with a predetermined reference axis, a sensor device indicating the Faraday effect, a second polarizer with a polarization axis forming a second polarizer angle η with the reference axis, and a second optical transmission path;

b) placing the sensor device in a calibrating magnetic field;

c) passing at least one light signal through the optical series circuit;

d) ascertaining a measurement signal for the calibrating magnetic field from a light intensity of the at least one light signal after passing through the series circuit;

e) in a first calibration step, setting the first polarizer angle θ to a value $\theta_1$ and setting the second polarizer angle η to a value $\eta_1$, thus essentially meeting a condition:

$$\sin(2\theta_1 - 2\eta_1) = 1 \text{ or } \sin(2\theta_1 - 2\eta_1) = -1,$$

and ascertaining a resultant measurement signal as a first calibration signal $M_1$ over a predetermined temperature range including at least two temperature values;

f) in a second calibration step, setting the first polarizer angle θ to a value $\theta_2$ and setting the second polarizer angle η to a value $\eta_2$, thus essentially meeting conditions:

$$\sin(2\theta_2 - 2\eta_2) = 1 \text{ or } \sin(2\theta_2 - 2\eta_2) = -1 \text{ and}$$

$$\cos(2\theta_2 + 2\eta_2) = -\cos(2\theta_1 + 2\eta_1), \text{ and}$$

ascertaining a resultant measurement signal as a second calibration signal $M_2$ over the predetermined temperature range;

g) in a third calibration step, ascertaining a correction factor K so that a calibration function:

$$M_K = (2 \cdot M_1 \cdot M_2)/(M_1 + M_2 + K \cdot (M_1 - M_2))$$

dependent on the first calibration signal, the second calibration signal and the correction factor, is substantially constant over the predetermined temperature range; and h) in a fourth calibration step, adjusting the polarizer angles θ and η of the two polarizers to essentially meet equations:

$$\sin(2\theta - 2\eta) = 1 \text{ or } \sin(2\theta - 2\eta) = -1, \text{ and}$$

$$\cos(2\theta + 2\eta) = K \cdot \cos(2\theta_1 + 2\eta_1).$$

2. A method for temperature calibration of an optical measurement array for measuring a magnetic field, which comprises:

a) providing an optical series circuit having a first optical transmission path, a first polarizer with a polarization axis forming a first polarizer angle θ with a predetermined reference axis, a sensor device indicating the Faraday effect, a second polarizer with a polarization axis forming a second polarizer angle η with the reference axis, and a second optical transmission path;

b) placing the sensor device in a calibrating magnetic field;

c) passing at least one light signal through the optical series circuit;

d) ascertaining a measurement signal for the calibrating magnetic field from a light intensity of the at least one light signal after passing through the series circuit;

e) in a first calibration step, setting the first polarizer angle θ to a value $\theta_1$ and setting the second polarizer angle η to a value $\eta_1$, thus essentially meeting a condition:

$$\sin(2\theta_1 - 2\eta_1) = 1 \text{ or } \sin(2\theta_1 - 2\eta_1) = -1,$$

and ascertaining a resultant measurement signal as a first calibration signal $M_1$ over a predetermined temperature range including at least two temperature values;

f) in a second calibration step, setting the first polarizer angle θ to a value $\theta_2$ and setting the second polarizer angle η to a value $\eta_2$, thus essentially meeting conditions:

$$\sin(2\theta_2 - 2\eta_2) = 1 \text{ or } \sin(2\theta_2 - 2\eta_2) = -1 \text{ and}$$

$$\cos(2\theta_2 + 2\eta_2) = -\cos(2\theta_1 + 2\eta_1), \text{ and}$$

ascertaining a resultant measurement signal as a second calibration signal $M_2$ over the predetermined temperature range;

g) in a third calibration step, ascertaining a correction factor K so that a calibration function:

$$M_K = (2 \cdot M_1 \cdot M_2)/(M_1 + M_2 + K \cdot (M_1 - M_2))$$

dependent on the first calibration signal, the second calibration signal and the correction factor, is substantially constant over the predetermined temperature range; and h) in a fourth calibration step, adjusting the polarizer angles θ and η of the two polarizers so that the resultant measurement signal, for at least one temperature value from the predetermined temperature range, is substantially equal to the calibration function $M_K$.

3. The method according to claim 1, which comprises:

a) traversing the optical series circuit by two light signals in opposed directions of passage; and b) setting the measurement signal to be equivalent to a quotient between two linear functions of the light intensities of the two light signals, in each case after they pass through the optical series circuit, or an effective value of the quotient.

4. The method according to claim 2, which comprises:

a) traversing the optical series circuit by two light signals in opposed directions of passage; and b) setting the measurement signal to be equivalent to a quotient between two linear functions of the light intensities of the two light signals, in each case after they pass through the optical series circuit, or an effective value of the quotient.

5. The method according to claim 3, which comprises setting the measurement signal proportional to a quotient between a difference and a sum of the light intensities of the two light signals, in each case after their passage through the optical series circuit, or to an effective value of the quotient.

6. The method according to claim 4, which comprises setting the measurement signal proportional to a quotient between a difference and a sum of the light intensities of the two light signals, in each case after their passage through the optical series circuit, or to an effective value of the quotient.

7. The method according to claim 1, which comprises:
   a) traversing the optical series circuit with a light signal;
   b) using a calibrating magnetic field with a substantially constant frequency spectrum above a predetermined frequency; and
   c) setting the measurement signal proportional to a quotient of an alternating component of the light intensity of the light signal after passing through the series circuit and a direct component of the light intensity, essentially including the frequency spectrum of the calibrating magnetic field in the alternating component, and having no frequencies from the frequency spectrum of the calibrating magnetic field in the direct component.

8. The method according to claim 2, which comprises:
   a) traversing the optical series circuit with a light signal;
   b) using a calibrating magnetic field with a substantially constant frequency spectrum above a predetermined frequency; and
   c) setting the measurement signal proportional to a quotient of an alternating component of the light intensity of the light signal after passing through the series circuit and a direct component of the light intensity, essentially including the frequency spectrum of the calibrating magnetic field in the alternating component, and having no frequencies from the frequency spectrum of the calibrating magnetic field in the direct component.

9. An optical measurement array for measuring a magnetic field, comprising:

an optical series circuit including a first optical transmission path, a first polarizer having a polarization axis forming a first polarizer angle $\theta$ with a predetermined reference axis, a sensor device indicating the Faraday effect, a second polarizer having a polarization axis forming a second polarizer angle $\eta$ with the reference axis, and a second optical transmission path;

the two polarizer angles $\theta$ and $\eta$ adjusted in accordance with the method of claim 1.

10. An optical measurement array for measuring a magnetic field, comprising:

an optical series circuit including a first optical transmission path, a first polarizer having a polarization axis forming a first polarizer angle $\theta$ with a predetermined reference axis, a sensor device indicating the Faraday effect, a second polarizer having a polarization axis forming a second polarizer angle $\eta$ with the reference axis, and a second optical transmission path;

the two polarizer angles $\theta$ and $\eta$ adjusted in accordance with the method of claim 2.

11. The measurement array according to claim 9, wherein said sensor device has a nonhomogeneous linear double refraction.

12. The measurement array according to claim 10, wherein said sensor device has a nonhomogeneous linear double refraction.

* * * * *